US012702061B2

(12) United States Patent
Zhou

(10) Patent No.: US 12,702,061 B2
(45) Date of Patent: Aug. 4, 2026

(54) SEMICONDUCTOR DIES INCLUDING RECESSES FOR FACILITATING MECHANICAL DEBONDING, AND ASSOCIATED SYSTEMS AND DEVICES

(71) Applicant: Micron Technology, Inc., Boise, ID (US)

(72) Inventor: Wei Zhou, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 784 days.

(21) Appl. No.: 17/883,486

(22) Filed: Aug. 8, 2022

(65) Prior Publication Data

US 2024/0047424 A1 Feb. 8, 2024

(51) Int. Cl.
*H10W 90/00* (2026.01)
*H10P 54/00* (2026.01)
*H10W 72/90* (2026.01)

(52) U.S. Cl.
CPC ............. *H10W 90/00* (2026.01); *H10P 54/00* (2026.01); *H10W 72/925* (2026.01); *H10W 72/951* (2026.01); *H10W 72/952* (2026.01); *H10W 72/953* (2026.01); *H10W 90/792* (2026.01); *H10W 90/794* (2026.01)

(58) Field of Classification Search
CPC ..... H01L 25/0657; H01L 21/78; H01L 24/05; H01L 24/08; H01L 2224/0569; H01L 2224/05639; H01L 2224/05644; H01L 2224/05647
See application file for complete search history.

(56) References Cited

U.S. PATENT DOCUMENTS

| | | | | |
|---|---|---|---|---|
| 2001/0055447 A1* | 12/2001 | Delprat | ................ | G02B 6/4228 |
| | | | | 385/52 |
| 2006/0261446 A1* | 11/2006 | Wood | ...................... | H01L 24/85 |
| | | | | 438/459 |
| 2019/0027441 A1* | 1/2019 | Chen | .................... | H01L 23/5389 |
| 2021/0050300 A1* | 2/2021 | Lin | ................ | H03K 19/018592 |

FOREIGN PATENT DOCUMENTS

CN           105084296 A   * 11/2015

\* cited by examiner

*Primary Examiner* — Mohammad M Choudhry
(74) *Attorney, Agent, or Firm* — Dorsey & Whitney LLP

(57) ABSTRACT

Semiconductor dies and devices, such as memory dies and devices, and associated systems and methods, are disclosed herein. A representative semiconductor die comprises a substrate including a first surface, a second surface opposite the first surface, a perimeter, and a recess formed into the first surface adjacent to the perimeter. The recess has a depth in a direction extending between the first surface and the second surface. The semiconductor die further comprises a first bonding structure on the first surface and a second bonding structure on the second surface. The first bonding structure has a thickness, and the depth is at least ten times greater than the thickness. The recess can facilitate mechanical debonding of the semiconductor die during a manufacturing process that includes stacking the semiconductor die within a semiconductor device package.

20 Claims, 12 Drawing Sheets

SEMICONDUCTOR DIES INCLUDING RECESSES FOR FACILITATING MECHANICAL DEBONDING, AND ASSOCIATED SYSTEMS AND DEVICES

TECHNICAL FIELD

The present disclosure generally relates to semiconductor dies, such as memory dies, including substrates having peripheral recesses to facilitate mechanical debonding of the semiconductor dies when the semiconductor dies are stacked in a semiconductor device package.

BACKGROUND

Memory packages or modules typically include multiple memory devices mounted on a substrate. Memory devices are widely used to store information related to various electronic devices such as computers, wireless communication devices, cameras, digital displays, and the like. Information is stored by programing different states of a memory cell. Various types of memory devices exist, including magnetic hard disks, random access memory (RAM), read only memory (ROM), dynamic RAM (DRAM), synchronous dynamic RAM (SDRAM), and others. Improving memory packages, generally, may include increasing memory cell density, increasing read/write speeds or otherwise reducing operational latency, increasing reliability, increasing data retention, reducing power consumption, reducing manufacturing costs, and reducing the size or footprint of the memory packages and/or components of the memory devices, among other metrics.

BRIEF DESCRIPTION OF THE DRAWINGS

Many aspects of the present technology can be better understood with reference to the following drawings. The components in the drawings are not necessarily to scale. Instead, emphasis is placed on illustrating clearly the principles of the present technology.

DETAILED DESCRIPTION

Figure 1A:
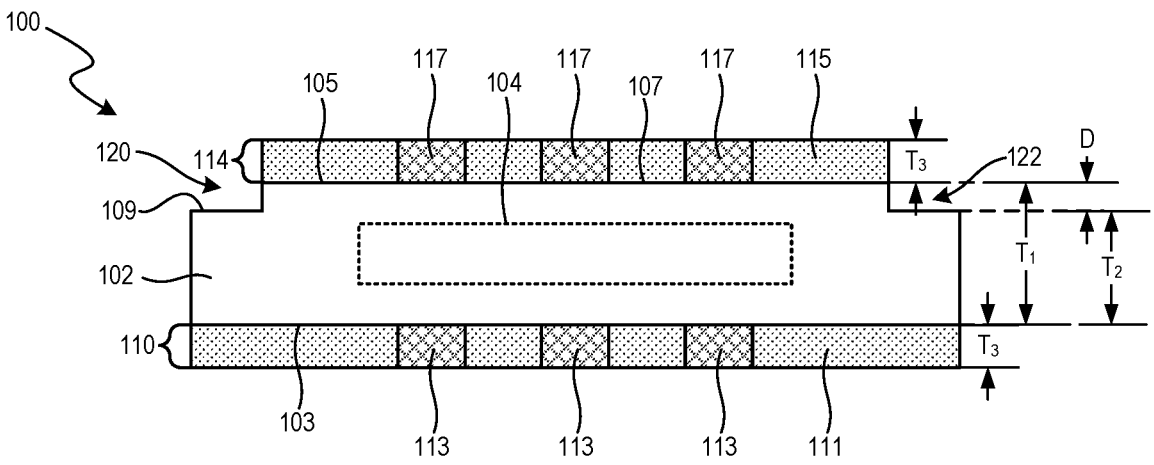
FIGS. 1A and 1B are a side cross-sectional view and a top view, respectively, of a semiconductor die in accordance with embodiments of the present technology.

Embodiments of the present technology are directed to semiconductor die and devices, such as memory dies and devices, and associated systems and methods. In several of the embodiments described below, a representative semiconductor die includes a substrate having a first surface, a second surface opposite the first surface, a perimeter, and a recess formed into the first surface adjacent to the perimeter. The recess has a depth in a direction extending between the first surface and the second surface. The semiconductor die further comprises a first bonding structure on the first surface and a second bonding structure on the second surface. The first bonding structure has a thickness, and the depth is at least ten times greater than the thickness. The first surface of the semiconductor die can be an upper surface or a lower surface of the semiconductor die.

A representative semiconductor device can include multiple ones of the semiconductor dies stacked on one another. During a manufacturing process used to form the semiconductor device, the semiconductor dies can be individually stacked on top of one another. In some aspects of the present technology, the recess formed in each semiconductor die can enable the semiconductor device to be "reworked" during manufacturing by enabling the removal of any individual one of the semiconductor dies that may be poorly stacked during manufacturing. More particularly, the depth of the recess can be significantly greater (e.g., at least 10 times greater, 40-50 times greater) than the thickness of the first bonding structure and therefore provide room for a tip of a pick device to be inserted therein for mechanical debonding.

Numerous specific details are discussed to provide a thorough and enabling description of embodiments of the present technology. A person skilled in the art, however, will understand that the technology may have additional embodiments and that the technology may be practiced without several of the details of the embodiments described below with reference to FIGS. 1A-9. In other instances, well-known structures or operations often associated with semiconductor devices, memory devices, semiconductor manufacturing, etc., are not shown, or are not described in detail, to avoid obscuring other aspects of the technology. In general, it should be understood that various other devices and systems in addition to those specific embodiments disclosed herein may be within the scope of the present technology.

As used herein, the terms "vertical," "lateral," "upper," "lower," "above," and "below" can refer to relative directions or positions of features in the semiconductor devices in view of the orientation shown in the Figures. For example, "upper" or "uppermost" can refer to a feature positioned closer to the top of a page than another feature. These terms, however, should be construed broadly to include semiconductor devices having other orientations, such as inverted or inclined orientations where top/bottom, over/under, above/below, up/down, and left/right can be interchanged depending on the orientation.

As used herein, unless expressly indicated otherwise, the terms "about," "approximately," "substantially" and the like mean within plus or minus 10% of the stated value.

Figure 1B:
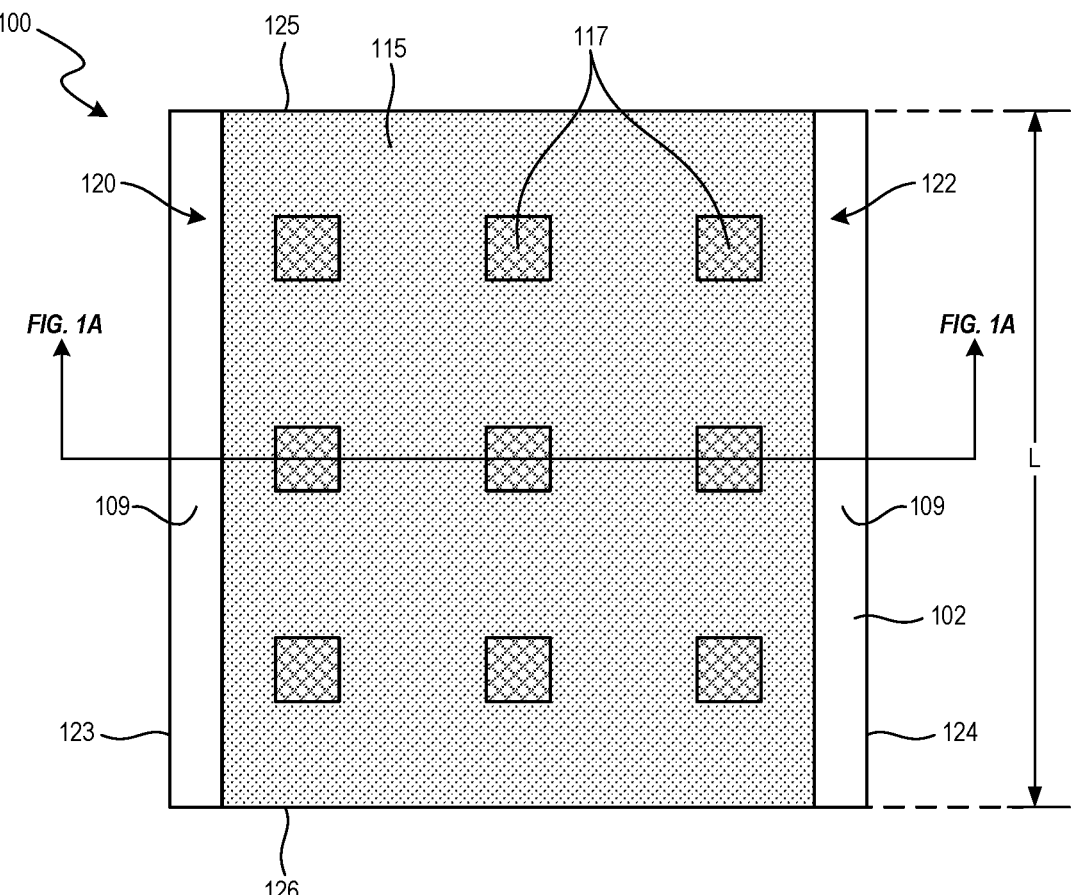

FIGS. 1A and 1B are a side cross-sectional view and a top view, respectively, of a semiconductor die 100 (e.g., a memory die) in accordance with embodiments of the present technology. Referring first to FIG. 1A, the semiconductor die 100 includes a semiconductor substrate 102 (e.g., a silicon substrate, a gallium arsenide substrate, an organic laminate substrate) having a first side 103 (e.g., a lower side, a lower surface) and a second side 105 (e.g., an upper side, an upper surface) opposite the first side 103. The semiconductor die 100 can further include one or more circuit elements 104 (shown schematically), such as wires, traces, interconnects, transistors, and/or the like formed in (e.g., embedded in) and/or on the substrate 102. In some embodiments, the first side 103 and/or the second side 105 of the substrate 102 can be an active side having the circuit elements 104 formed therein and/or on. For example, metal traces can be formed on the first side 103 or the second side of the 105 of the substrate 102 while integrated circuit elements can be located in the substrate 102 beneath the metal traces. The circuit elements 104 can include integrated memory circuitry and/or logic circuitry, which can include various types of semiconductor components and functional features, such as dynamic random-access memory (DRAM), static random-access memory (SRAM), flash memory, other forms of integrated circuit memory, processing circuits, imaging components, and/or other semiconductor features. In some embodiments, the semiconductor die 100 is a memory die including integrated memory circuitry. In other embodiments, the substrate 102 can be a "blank" substrate that does not include integrated circuit components and that is formed from, for example, crystalline, semi-crystalline, and/or ceramic substrate materials, such as silicon, polysilicon, aluminum oxide ($Al_2O_3$), sapphire, and/or other suitable materials.

In the illustrated embodiment, the semiconductor die 100 further includes a first bonding layer or structure 110 (e.g., a first hybrid bonding structure) over the first side 103 of the substrate 102 and a second bonding layer or structure 114 (e.g., a second hybrid bonding structure) over the second side 105 of the substrate 102. The first and second bonding structures 110, 114 (collectively "the bonding structures 110, 114") can be generally similar or identical. For example, the first bonding structure 110 can include a first passivation material 111 and first conductive contacts 113, and the second bonding structure 114 can include a second passivation material 115 and second conductive contacts 117. The first and second passivation materials 111, 115 (collectively "the passivation materials 111, 115") can comprise silicon dioxide (SiOx), tetraethyl orthosilicate (TEOS), other oxide materials, a dielectric material, and/or the like. The first and second conductive contacts 113, 117 (collectively "the conductive contacts 113, 117") can comprise copper, nickel, gold, indium, silver, solder (e.g., SnAg-based solder), conductor-filled epoxy, and/or other electrically conductive materials. The passivation materials 111, 115 surround and electrically insulate the conductive contacts 113, 117, respectively. The conductive contacts 113, 117 can be electrically coupled to one or more the circuit elements 104 and can comprise any number of contacts arrayed over the substrate 102. In some embodiments, the semiconductor die 100 can further includes one or more vias (not shown; e.g., through-silicon vias (TSVs)) extending through the substrate 102 from the first side 103 to the second side 105 and electrically coupling one or more of the first conductive contacts 113 to the second conductive contacts 117 and/or electrically coupling the conductive contacts 113, 117 to the circuit elements 104.

Referring to FIGS. 1A and 1B together, the semiconductor die 100 further includes a (i) first recess 120 (e.g., a cavity, a groove, a gutter, an indentation) and (ii) a second recess 122 at the second side 105 of the substrate 102 and defining a first side portion 107 and a second side portion 109 of the second side 105. That is, the first and second recesses 120, 122 (collectively "the recesses 120, 122") can define steps in the second side 105 of the substrate 102 at a perimeter of the substrate 102. The second bonding structure 114 is positioned on the first side portion 107 and omitted from the second side portion 109. As described in greater detail below with reference to FIGS. 4-6, the recesses 120, 122 can facilitate mechanical debonding of the semiconductor die 100 when the semiconductor die 100 is incorporated into (e.g., stacked in) a semiconductor device package.

Referring again to FIG. 1A, (i) the substrate 102 can have a first thickness $T_1$ between the first side 103 and the first side portion 107 of the second side 105 of between about 200-1000 μm, (ii) the substrate 102 can have a second thickness $T_2$ between the first side 103 and the second side portion 109 of the second side 105 less than the first thickness $T_2$ and between about 200-1000 μm, (iii) the recesses 120, 122 can each have a depth D extending in a direction between the first side 103 and the second side 105 of the substrate 102 of between about 1-10 μm (e.g., between about 1-5 μm, between about 4-5 μm, about 4 μm, about 5 μm) and that is defined as the difference between the first and second thicknesses $T_1$, $T_2$, and (iv) the bonding structures 110, 114 can each have a third thickness $T_3$ of between about 10-200 nm (e.g., between about 50-100 nm, about 100 nm). Accordingly, the relative dimensions of the various components shown in FIG. 1A are shown to clearly illustrate the features of the present technology and are not necessarily to scale and that, for example, the depth D of the recesses 120, 122 can be greater (e.g., significantly greater) than the thickness $T_3$ of the bonding structures 110, 114. In some embodiments, the depth D is between about 10-100 times (e.g., at least 10 times, between about 10-50, between about 40-50, about 40 times, about 50 times) greater than the thicknesses $T_3$ of the bonding structures 110, 114.

Referring to FIG. 1B, the substrate 102 has a generally rectilinear (e.g., square, rectangular) shape including a first edge 123 opposite a second edge 124 and a third edge 125 opposite a fourth edge 126 (collectively "the edges 123-126"). The edges 123-126 together define a perimeter or periphery of the semiconductor die 100. In other embodiments, the substrate 102 can have other shapes, such as circular, polygonal, triangular, oval, irregular, etc. In the illustrated embodiment, the first recess 120 is formed adjacent to the first edge 123 and along an entire length L of the first edge 123 (e.g., entirely between the third edge 125 and the fourth edge 126), and the second recess 122 is formed adjacent to the second edge 124 along the entire length L of the second edge 124 (e.g., entirely between the third edge 125 and the fourth edge 126). That is, the recesses 120, 122 are formed adjacent to the perimeter of the substrate 102 and the semiconductor die 100.

In other embodiments, the first recess 120 and/or the second recess 122 can be omitted, the first recess 120 and/or the second recess 122 can have different extents and/or positions relative to the edges 123-126, and/or the semiconductor die 100 can include additional ones of the recesses. FIG. 2A-2D, for example, are top views of the semiconductor die 100 in accordance with additional embodiments of the present technology and illustrating different configurations of recesses at the perimeter of the semiconductor die 100.

Figure 2A:
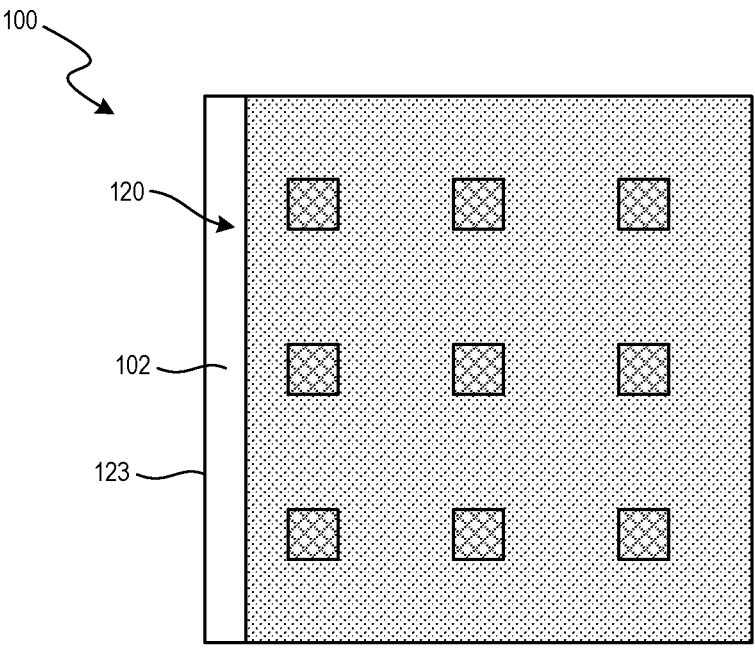
FIG. 2A-2D are top views of the semiconductor die of FIGS. 1A and 1B in accordance with additional embodiments of the present technology and illustrating different configurations of recesses at a perimeter of the semiconductor die.

Referring first to FIG. 2A, in the illustrated embodiment the second recess 122 (FIGS. 1A and 1B) is omitted and the semiconductor die 100 only includes the first recess 120 formed adjacent to the first edge 123 of the substrate 102 and along the entire length of the first edge 123.

Figure 2B:
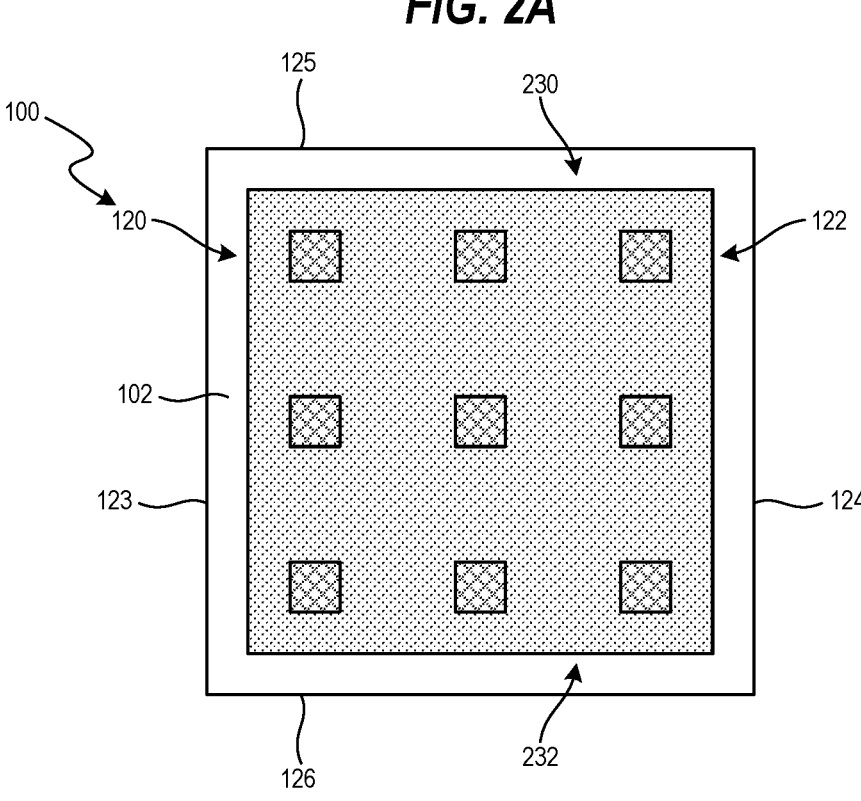

Referring next to FIG. 2B, in the illustrated embodiment the semiconductor die 100 includes an additional third recess 230 formed adjacent to the third edge 125 along an entire length of the third edge 125, and an additional fourth recess 232 formed adjacent to the fourth edge 126 along an entire length of the fourth edge 126. That is, the first recess 120, the second recess 122, the third recess 230, and the fourth recess 232 can collectively extend around the entire perimeter of the substrate 102 and the semiconductor die 100.

Figure 2C:
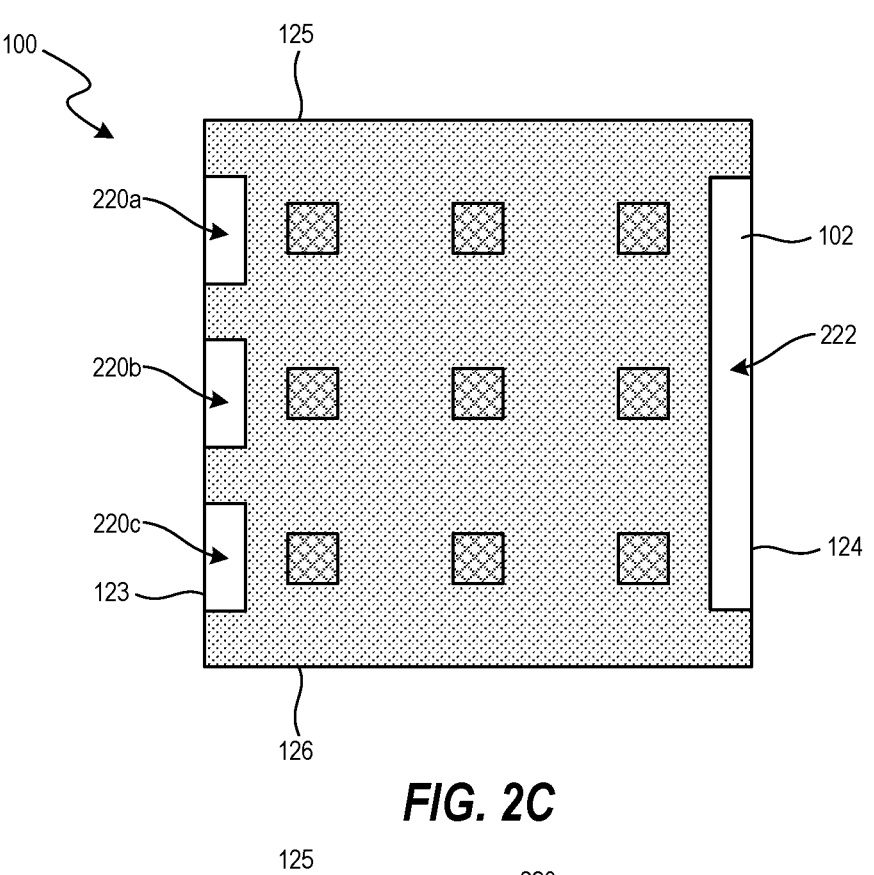

Referring next to FIG. 2C, in the illustrated embodiment the semiconductor die 100 includes (i) multiple first recesses 220 (identified individually as first recesses 220a-c) formed adjacent to the first edge 123 of the substrate 102 and that extend only partially along the length of the first edge 123 and (ii) a single second recess 222 formed adjacent to the second edge 124 of the substrate 102 and that extends only partially along the length of the second edge 124 (e.g., only partially between the third edge 125 and the fourth edge 126). Accordingly, the first recesses 220 each have a length along the first edge 123 that is shorter than the first recess 120 shown in FIGS. 1A-2B. Likewise, the second recess 222 has a length along the second edge 124 that is shorter than the second recess 122 shown in FIGS. 1A, 1B, and 2B.

Figure 2D:
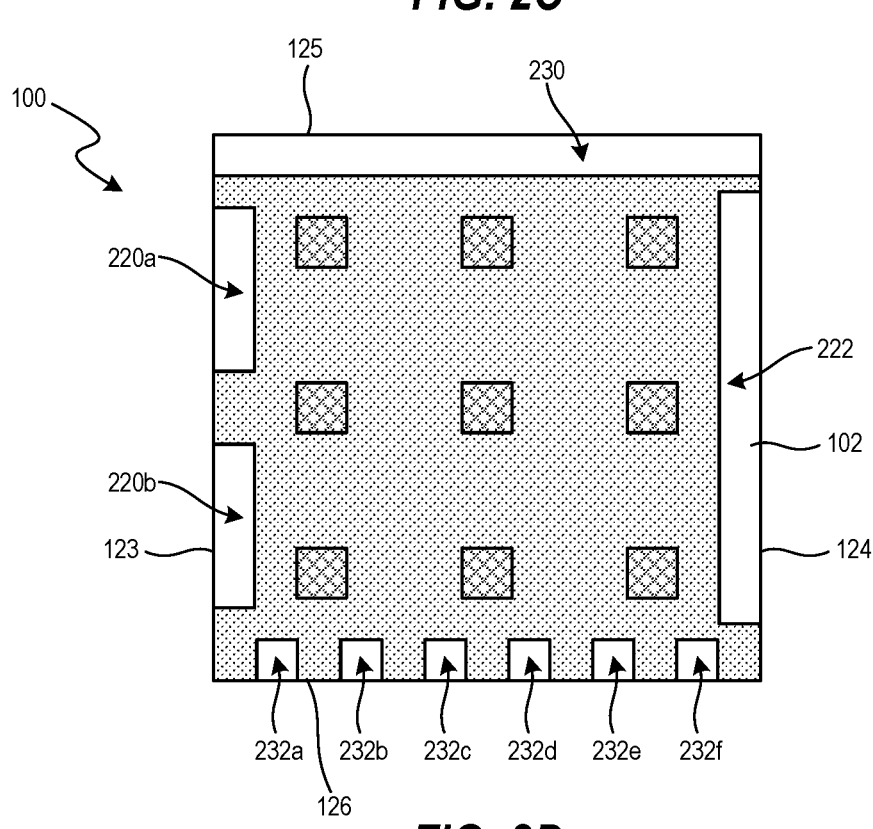

In general, the number of the recesses along each of the edges 123-126 (e.g., the number of the first recesses 220) can vary to include more or fewer recesses, and/or the length of the recesses along the edges 123-126 can vary to be longer or shorter along the length of the edges 123-126. Referring next to FIG. 2D, for example, in the illustrated embodiment the semiconductor die 100 includes (i) multiple first recesses 220 (identified individually as first recesses 220a-b) formed adjacent to the first edge 123 of the substrate 102 and that extend only partially along the length of the first edge 123, (ii) a single second recess 222 formed adjacent to the second edge 124 of the substrate 102 and that extends only partially along the length of the second edge 123, (iii) a third recess 230 formed adjacent to the third edge 125 along an entire length of the third edge 125, and (iv) and multiple fourth recesses 232 (identified individually as fourth recesses 232a-f) formed adjacent to the fourth edge 126 of the substrate 102 and that extend only partially along the length of the fourth edge 126.

Figure 3:
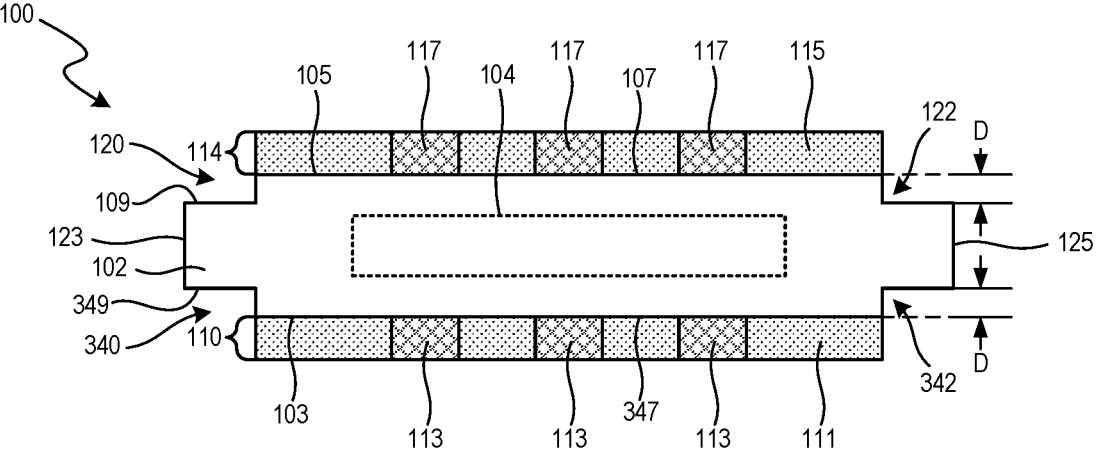
FIG. 3 is a side cross-sectional view of the semiconductor die in accordance with additional embodiments of the present technology.

Further, the semiconductor die 100 can additionally or alternatively include one or more recesses formed in first side 103 of the substrate 102. For example, FIG. 3 is a side cross-sectional view of the semiconductor die 100 in accordance with additional embodiments of the present technology. In the illustrated embodiment, the semiconductor die 100 further includes a third recess 340 and a fourth recess 342 at the first side 103 of the substrate 102 and defining a first side portion 347 and a second side portion 349 of the first side 103. That is, the third and fourth recesses 340, 342 (collectively "the recesses 340, 342") can define steps in the first side 103 of the substrate 102 and are positioned at/adjacent to the perimeter of the substrate 102 and the semiconductor die 100. The second bonding structure 114 is positioned on the first side portion 347 and omitted from the second side portion 349. The recesses 340, 342 can be generally similar to the recesses 120, 122 (and/or any of the recesses shown in FIGS. 2A-2D) having, for example, the same depth D.

Figure 4:
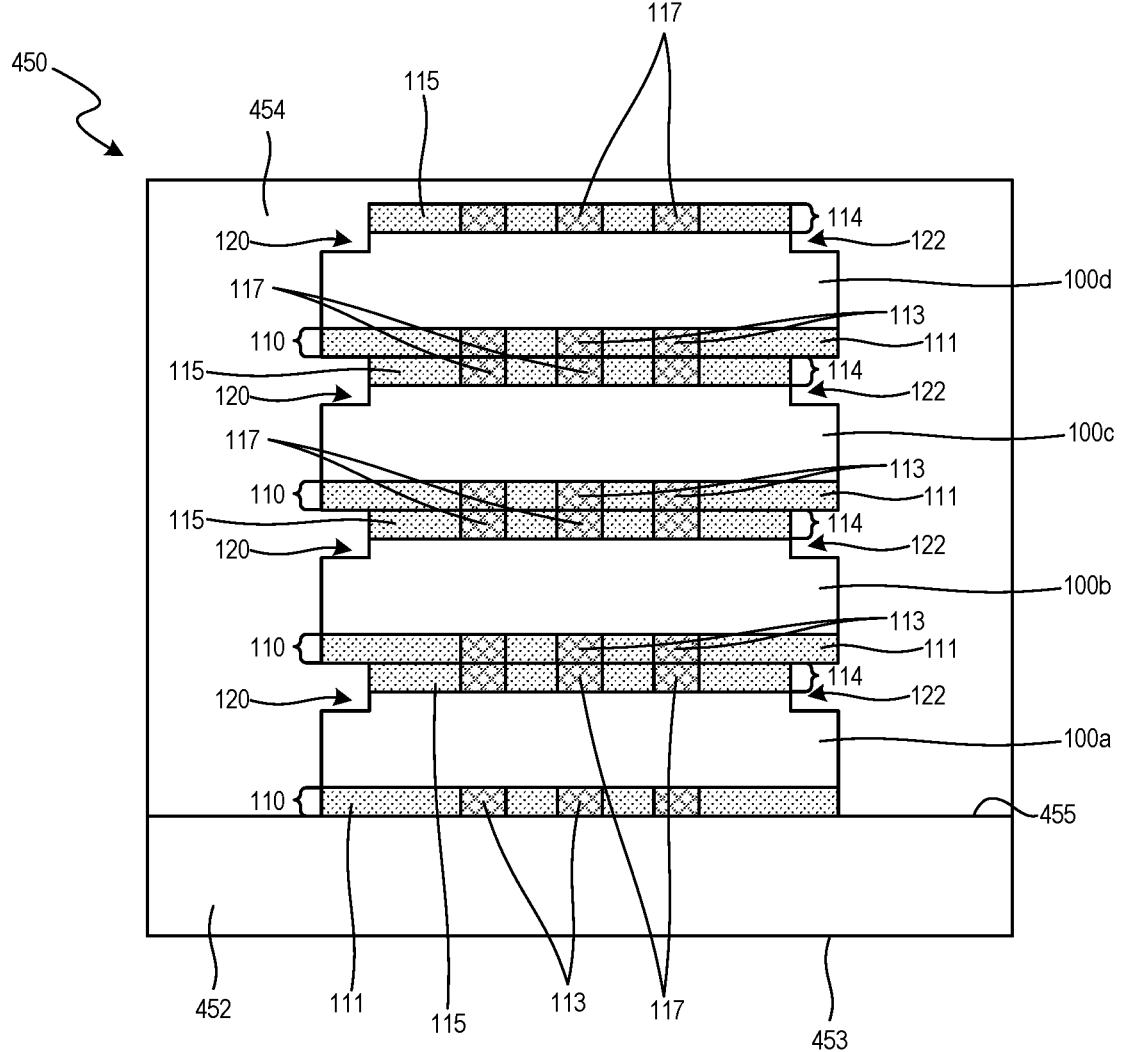
FIG. 4 is a side cross-sectional view of a semiconductor device including a plurality of the semiconductor dies of FIGS. 1A and 1B in accordance with embodiments of the present technology.

FIG. 4 is a side cross-sectional view of a semiconductor device 450 (e.g., a semiconductor package, a hybrid memory cube) including a plurality of the semiconductor dies 100 (identified individually as first through fourth semiconductor dies 100a-d, respectively) in accordance with embodiments of the present technology. The semiconductor dies 100 are configured as shown in FIGS. 1A and 1B but, in other embodiments, can have any of the configurations shown in FIGS. 2A-3 and/or otherwise described herein. Further, while four of the semiconductor dies 100 are shown in FIG. 4, the semiconductor device 450 can include more or fewer of the semiconductor dies 100 in the stack (e.g., one, two, three, six, eight, twelve, sixteen, or more of the semiconductor dies 100).

In the illustrated embodiment, the semiconductor device 450 includes a package substrate 452 and the semiconductor dies 100 are stacked on/over the package substrate 452. The package substrate 452 can be a printed circuit board (PCB), an interposer, a dielectric spacer, a semiconductor die (e.g., a logic die), and/or the like. In some embodiments, the package substrate 452 is a direct chip attach (DCA) substrate. The package substrate 452 can include (i) a plurality of electrical connectors (e.g., solder balls; not shown) on a first side 453 of the package substrate 452 configured to electrically couple the conductive contacts of the package substrate 452 (and the semiconductor dies 100) to external circuitry (not shown) and (ii) a plurality of conductive contacts (not shown) on a second side 455 thereof that can be electrically coupled to the first conductive contacts 113 of the lowermost first semiconductor die 100a. The semiconductor device 450 can further include a molded material 454 over the package substrate 452 and at least partially around the semiconductor dies 100 (e.g., encapsulating the semiconductor dies 100).

In the illustrated embodiment, the first semiconductor die 100a is bonded to the package substrate 452 and the second semiconductor die 100b, the second semiconductor die 100b is bonded to the first semiconductor die 100a and the third semiconductor die 100c, the third semiconductor die 100c is bonded to the second semiconductor die 100b and the fourth semiconductor die 100d, and the fourth semiconductor die 100d is bonded to the third semiconductor die 100c. More particularly, in some embodiments the first conductive contacts 113 and the first passivation material 111 of the first bonding structure 110 of the first semiconductor die 100a are bonded to the second side 455 of the package substrate 452. Likewise, (i) the second conductive contacts 117 and the second passivation material 115 of the second bonding structure 114 of the first semiconductor die 100a are bonded to the first conductive contacts 113 and the first passivation material 111 of the first bonding structure 110 of the second semiconductor die 100b, (ii) the second conductive contacts 117 and the second passivation material 115 of the second bonding structure 114 of the second semiconductor die 100b are bonded to the first conductive contacts 113 and the first passivation material 111 of the first bonding structure 110 of the third semiconductor die 100b, and (iv) the second conductive contacts 117 and the second passivation material 115 of the second bonding structure 114 of the third semiconductor die 100c are bonded to the first conductive contacts 113 and the first passivation material 111 of the first bonding structure 110 of the fourth semiconductor die 100b.

In some embodiments, the bonding structures 110, 114 of the semiconductor dies 100 (e.g., adjacent ones of the semiconductor dies 100) can be bonded together via a thermo-compression bonding (TCB) process that directly secures the conductive contacts 113, 117 and the passivation materials 111, 115 of adjacent ones of the semiconductor dies 100 together. In some embodiments, the semiconductor dies 100 are bonded together and to the package substrate 452 when the package substrate 452 is part of a larger wafer. Accordingly, the semiconductor device 450 can be formed via chip-to-wafer (C2 W) hybrid bonding process.

Figure 5:
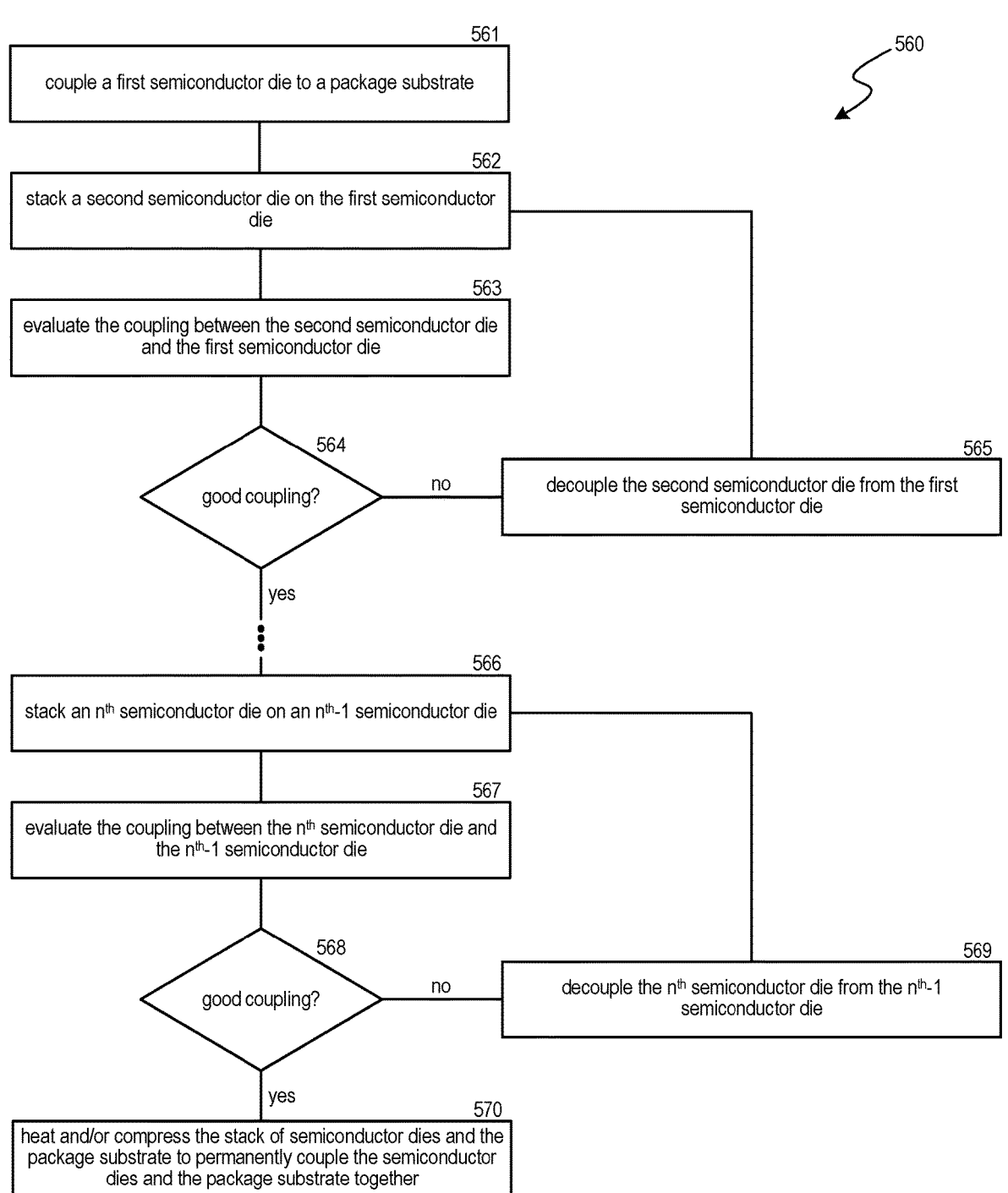
FIG. 5 is a flow diagram of a process or method for manufacturing the semiconductor device of FIG. 4 in accordance with embodiments of the present technology.

In some aspects of the present technology, the first recesses 120 and/or the second recesses 122 can facilitate mechanical debonding of any of the semiconductor dies 100 that may be stacked wrongly during a manufacturing process used to form the semiconductor device 450. More specifically, FIG. 5 is a flow diagram of a process or method 560 for manufacturing a semiconductor device (e.g., the semiconductor device 450) in accordance with embodiments of the present technology. Although some features of the method 560 are described in the context of the semiconductor dies 100 and the semiconductor device 450 shown in FIGS. 1A-4 for the sake of illustration, the method 560 can be carried out to form other semiconductor devices described herein.

At block 561, the method 560 can include coupling the first semiconductor die 100a to the package substrate 452. For example, a stacking system (e.g., a pick-and-place system) can position the first semiconductor die 100a on the package substrate 452. The coupling can be a temporary bond between the first semiconductor die 100a and the package substrate 452. For example, the first bonding structure 110 (e.g., the first passivation material 111) of the first semiconductor die 100a can temporarily adhere the first semiconductor die 100a to the package substrate 452. In some embodiments, the first semiconductor die 100a and/or the package substrate 452 can include an adhesive material or film (e.g.; a die-attach material; not shown in FIGS. 1A-4) configured to temporarily adhere the first semiconductor die 100a to the package substrate 452.

At block 562, the method 560 can include coupling the second semiconductor die 100b to the first semiconductor die 100a. For example, the stacking system can position the second semiconductor die 100b on the first semiconductor die 100a. The coupling can be a temporary bond between the second semiconductor die 100b and the first semiconductor die 100a. For example, the first bonding structure 110 (e.g., the first passivation material 111) of the first semiconductor die 100a and/or the second bonding structure 114 (e.g., the second passivation material 115) of the second semiconductor die 100b can temporarily adhere the second semiconductor die 100b to the first semiconductor die 100a. In some embodiments, the first semiconductor die 100a and/or the second semiconductor die 100b can include an adhesive material or film (e.g.; a die-attach material; not shown in FIGS. 1A-4) configured to temporarily adhere the second semiconductor die 100b to the first semiconductor die 100a.

At block 563, the method 560 can include evaluating the coupling between the second semiconductor die 100b and the first semiconductor die 100a. For example, block 563 can include detecting whether the second semiconductor die 100b is offset (e.g., laterally offset) relative to the first semiconductor die 100a. In some embodiments, a camera can provide optical feedback about the coupling between the second semiconductor die 100b and the first semiconductor die 100a (e.g., optical information indicating that the second semiconductor die 100b is offset relative to the first semiconductor die 100a), an electrical test system can provide electrical feedback about the coupling between the second semiconductor die 100b and the first semiconductor die 100a (e.g., electrical information indicating that the first conductive contacts 113 of the second semiconductor die 100b are not electrically coupled to or poorly electrically coupled to corresponding ones of the second conductive contacts 117 of the first semiconductor die 100a), and so on.

At decision block 564, the method 560 can include determining based on the evaluation at block 563 if the coupling between the second semiconductor die 100b and the first semiconductor die 100a is "good" (e.g., sufficient, within a threshold tolerance). If no, the method 560 can proceed to block 565. If yes, the method 560 can proceed to block 566.

Figure 6A:
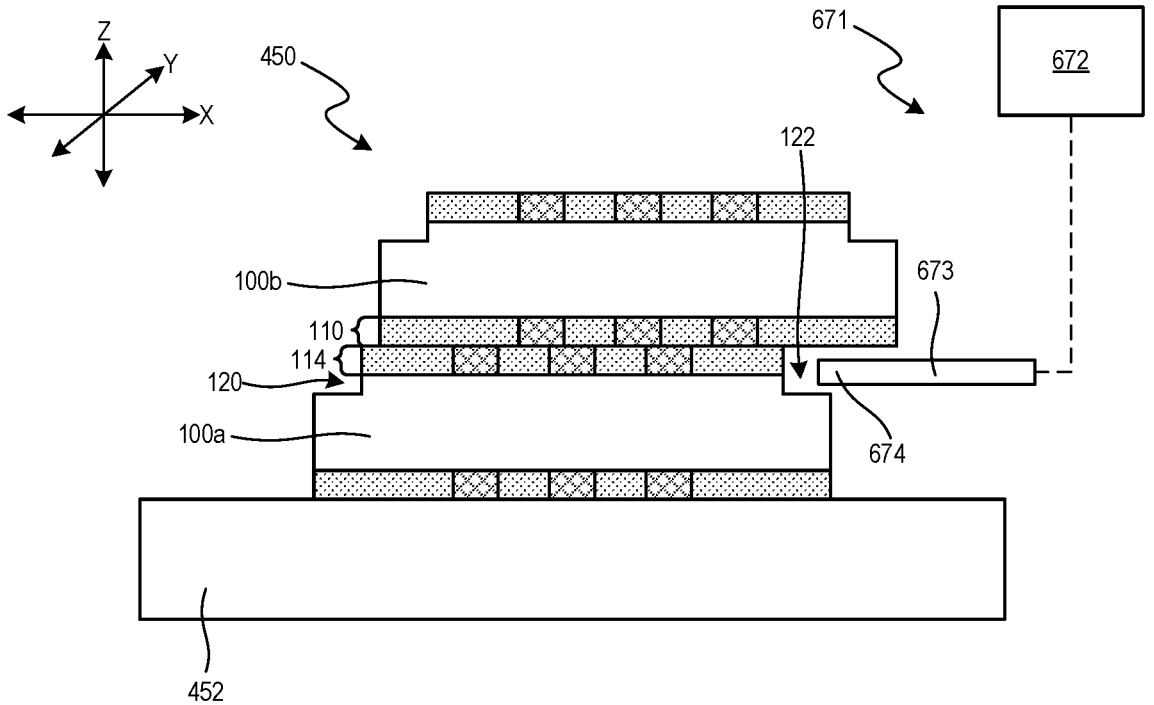
FIG. 6A is a side cross-sectional view of the semiconductor device of FIG. 4 during manufacturing in accordance with embodiments of the present technology.

At block 565, the method 560 can include decoupling the second semiconductor die 100b from the first semiconductor die 100a. For example, FIG. 6A is a side cross-sectional view of the semiconductor device 450 after coupling the second semiconductor die 100b to the first semiconductor die 100a in accordance with embodiments of the present technology. In the illustrated embodiment, the second semiconductor die 100b is laterally offset from the first semiconductor die 100a such that the coupling is "bad" (block 564).

Figure 6B:
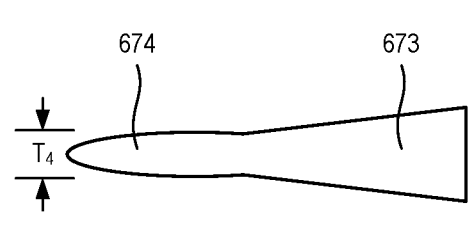
FIGS. 6B and 6C are an enlarged side view and an enlarged top plan view, respectively, of a tip of a pick device in accordance with embodiments of the present technology.
Figure 6C:
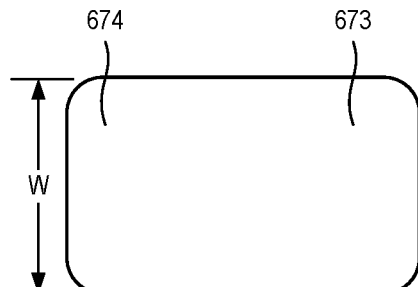

In some embodiments, a pick system 671 can be used to mechanically decouple/debond the second semiconductor die 100b from the first semiconductor die 100a. The pick system 671 can include a control system 672 and a pick device 673 operatively coupled to the control system 672. The control system 672 is operable to move the pick device 673 relative to one or more axes (e.g., along one or more of the axes indicated by reference numerals X, Y and Z). FIGS. 6B and 6C are an enlarged side view and an enlarged top plan view, respectively, of a tip 674 of the pick device 673 in accordance with embodiments of the present technology. Referring to FIGS. 1A and 6A-6C together, the tip 674 can have a thickness $T_4$ less than a depth D of the first recess 120 and/or the second recess 122. For example, the thickness $T_4$ can be between about 1-5 μm. The tip 674 can further have a width W greater than the thickness $T_4$. In some embodiments, the width W can be greater than the length L of the recesses 120, 122, less than the length L, or about the same as the length L.

To decouple the second semiconductor die 100b from the first semiconductor die 100a, the control system 672 can actuate the pick device 673 to (i) insert/position the tip 674 at least partially in the first recess 120 and/or the second recess 122 of the first semiconductor die 100a and then (ii) mechanically remove the second semiconductor die 100b by, for example, lifting the second semiconductor die 100b away from the first semiconductor die 100a (e.g., in the direction of the axis Z) to mechanically decouple the second semiconductor die 100b from the first semiconductor die 100a. In some embodiments, the control system 672 can move the tip 674 only to loosen the bond between the first semiconductor die 100a and the second semiconductor die 100b, and a separate system (e.g., the stacking system) can then remove the second semiconductor die 100b from over the first semiconductor die 100a. Accordingly, in some embodiments the pick system 671 can be integral with and/or used in conjunction with the stacking system used to stack the semiconductor dies 100. The tip 674 is shown to be inserted into the second recess 122 in FIG. 6A, but could additionally or alternatively be inserted into the first recess 120 to loosen/decouple the second semiconductor die 100b from the first semiconductor die 100a.

After decoupling the second semiconductor die 100b from the first semiconductor die 100a, the method 560 can return to block 562 to stack the same second semiconductor die 100b or a new second semiconductor die 100b on the first semiconductor die 100a.

At block 566, the method 560 can include stacking an $n^{th}$ one of the semiconductor dies 100 on an $n^{th}$–1 one of the semiconductor dies 100. For example, the third semiconductor die 100c is stacked on the second semiconductor die 100b, the fourth semiconductor die 100d is stacked on the third semiconductor die 100c, and so on, until a desired number of the semiconductor dies 100 are stacked together.

After stacking each individual one of the semiconductor dies 100, at blocks 567 and 568, the method 560 can include evaluating the coupling between the semiconductor dies 100 and determining if the coupling is "good" in the same or a similar manner as blocks 563 and 564 described in detail above. Likewise, if the coupling is "bad" (decision block "no"), the method 560 can include decoupling the semiconductor dies 100 from one another and stacking the same or a new $n^{th}$ one of the semiconductor dies 100 on the $n^{th}$–1 one of the semiconductor dies 100 in the same or a similar manner as block 565 described in detail above.

Accordingly, in some aspects of the present technology the recesses 120, 122 allow the semiconductor device 450 to be "reworked" during manufacturing by enabling the removal of any individual one of the semiconductor dies 100 that may be poorly stacked during manufacturing. More particularly, the depth D of the recesses 120, 122 is significantly greater (e.g., at least 10 times greater, 40-50 times greater) than the thickness $T_3$ of the bonding structures 110, 114 and therefore provide room for the tip 674 of the pick device 673 to be inserted between the semiconductor dies 100 in the stack. In contrast, without the recesses 120, 122, it is expected to be difficult or impossible to manufacture and/or control a pick device to loosen the bonds between the bonding structures 110, 114 of poorly stacked ones of the semiconductor dies 100. Moreover, the pick device 673 can be inserted into the recesses 120, 122 without damaging the second bonding structure 114 of the lower one of the semiconductor dies 100 in the stack.

Finally, after stacking all of the semiconductor dies 100, at block 570 the method 560 can include heating and/or compressing the stack of the semiconductor dies 100 and the package substrate 452 to permanently couple the semiconductor dies 100 and the package substrate 452 together. In some embodiments, the heating and/or compressing comprises a TCB process.

FIGS. 7A-7F are side cross-sectional views illustrating various stages in a method of manufacturing the semiconductor die 100 of FIGS. 1A and 1B in accordance with embodiments of the present technology. Generally, the semiconductor die 100 can be manufactured, for example, as a discrete device or as part of a larger wafer or panel. In wafer-level or panel-level manufacturing, a larger structure is formed before being singulated to form a plurality of individual structures. For ease of explanation and understanding, FIGS. 7A-7F illustrate the fabrication of a single semiconductor die 100. However, the fabrication of the semiconductor die 100 can be scaled to the wafer and/or panel level—that is, to include many more components so as to be capable of being singulated into two or more semiconductor dies 700—while including similar features and using similar processes as described herein.

Figure 7A:
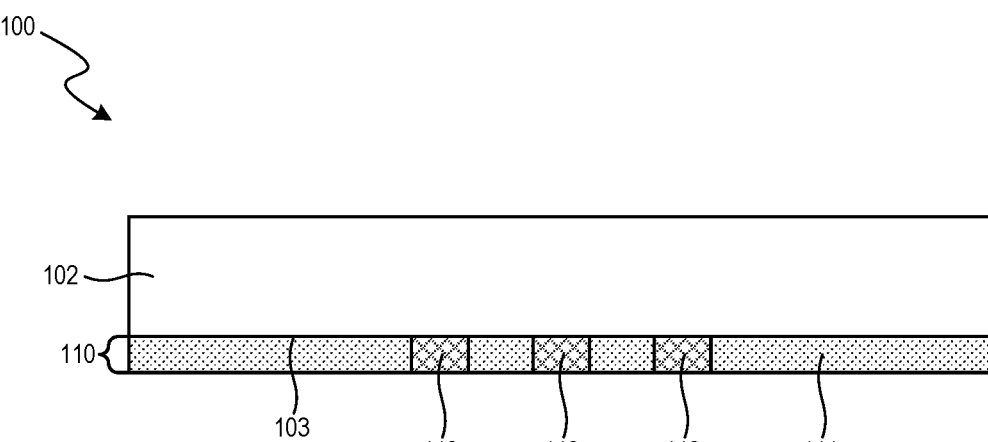
FIGS. 7A-7F are side cross-sectional views illustrating various stages in a method of manufacturing the semiconductor die of FIGS. 1A and 1B in accordance with embodiments of the present technology.

Referring first to FIG. 7A, fabrication of the semiconductor die 100 begins with formation of the first bonding structure 110 on the first side 103 of the substrate 102. The first conductive contacts 113 can be formed using suitable semiconductor wafer fabrication processes such as sputtering, physical vapor deposition (PVD), electroplating, lithography, etc. The first passivation material 111 can be deposited using suitable semiconductor wafer fabrication processes such as film deposition, chemical vapor deposition, physical vapor deposition, atomic layer deposition, spin coating, and/or other suitable techniques. In some embodiments, the first bonding structure 110 can be planarized after its formation.

Figure 7B:
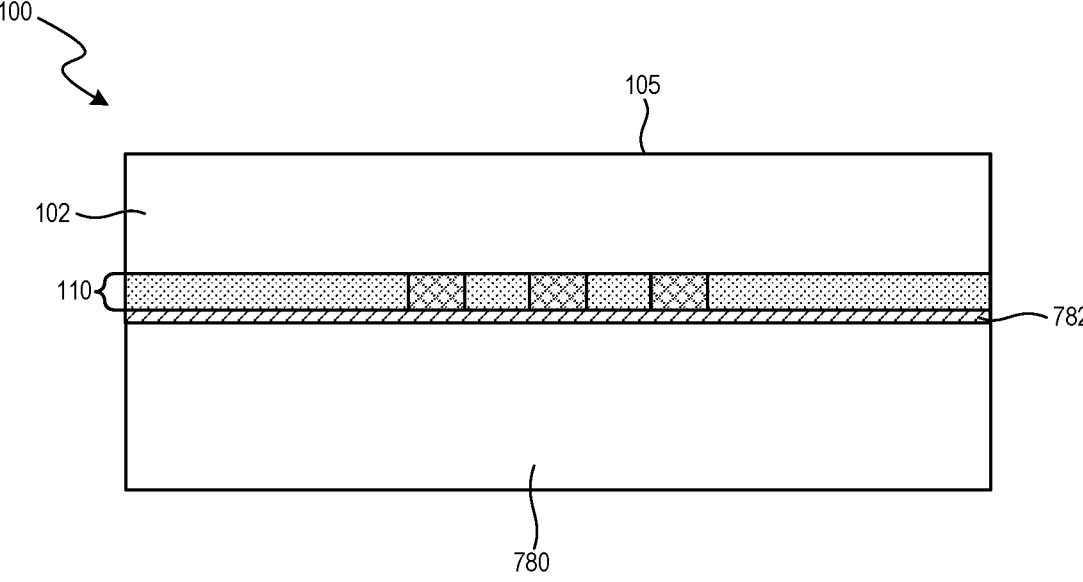

FIG. 7B illustrates the semiconductor die 100 after mounting the semiconductor die 100 to a carrier 780 via a release layer 782. The carrier 780 provides mechanical support for subsequent processing stages and can be a temporary carrier formed from, for example, silicon, silicon-on-insulator, compound semiconductor (e.g., Gallium Nitride), glass, and/or other suitable materials. In some embodiments, the carrier 780 can be reused after it is subsequently removed. The release layer 782 inhibits or even prevents direct contact of the first bonding structure 110 with the carrier 780 and therefore protects the first bonding structure 110 from possible contaminants on the carrier 780. The release layer 782 can be a disposable film (e.g., a laminate film of epoxy-based material) or other suitable material. In some embodiments, the release layer 782 is laser-sensitive or photo-sensitive to facilitate its removal at a subsequent stage. In some embodiments, the substrate 102 can be thinned at the second side 105 via, for example, a planarization process.

Figure 7C:
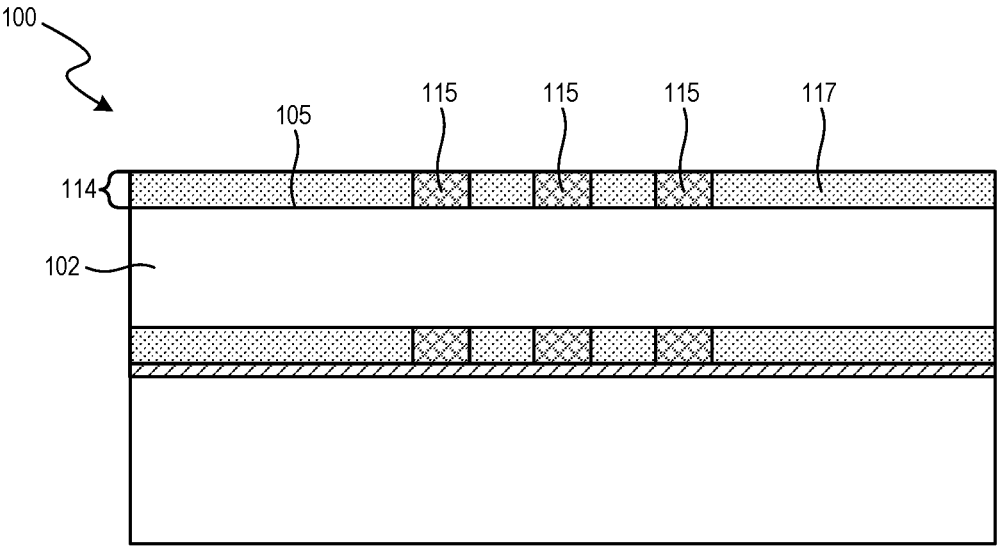

FIG. 7C illustrates the semiconductor die 100 after formation of the second bonding structure 114 on the second side 105 of the substrate 102. The second conductive contacts 117 can be formed using suitable semiconductor wafer fabrication processes such as sputtering, physical vapor deposition (PVD), electroplating, lithography, etc. The second passivation material 115 can be deposited using suitable semiconductor wafer fabrication processes such as film deposition, chemical vapor deposition, physical vapor deposition, atomic layer deposition, spin coating, and/or other suitable techniques. In some embodiments, the second bonding structure 114 can be planarized after its formation.

Figure 7D:
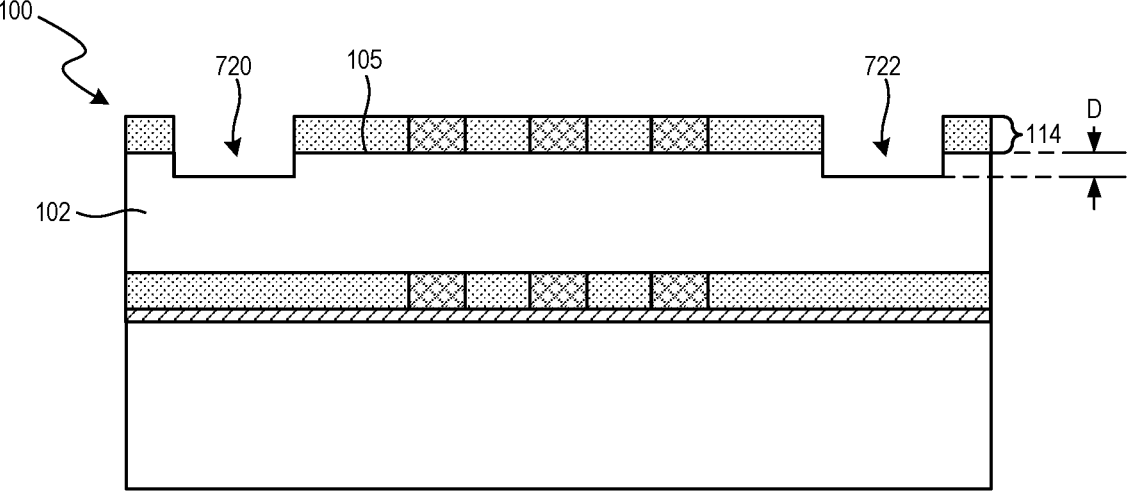

Referring next to FIG. 7D, fabrication of the semiconductor die 100 continues by etching/grooving the second bonding structure 114 and the second side 105 of the substrate 102 to form a first cavity 720 and a second cavity 722. The first cavity 720 and the second cavity 722 (collectively "the cavities 720, 722") can be formed using a laser grooving process or, in other embodiments, can be etched using suitable semiconductor wafer fabrication processes such as an anisotropic etching process, a dry etching process, a plasma etching process, wet etching process, etc. In some embodiments, a protection layer (not shown) can be formed over the second bonding structure 114 prior to forming the cavities 720, 722 to protect the second bonding structure 114 during the etching of the cavities 720, 722. In some embodiments, the cavities 720, 722 can be etched to have the depth D within the substrate 102 corresponding to the depth D of the recesses 120, 122 (FIGS. 1A and 1B).

Figure 7E:
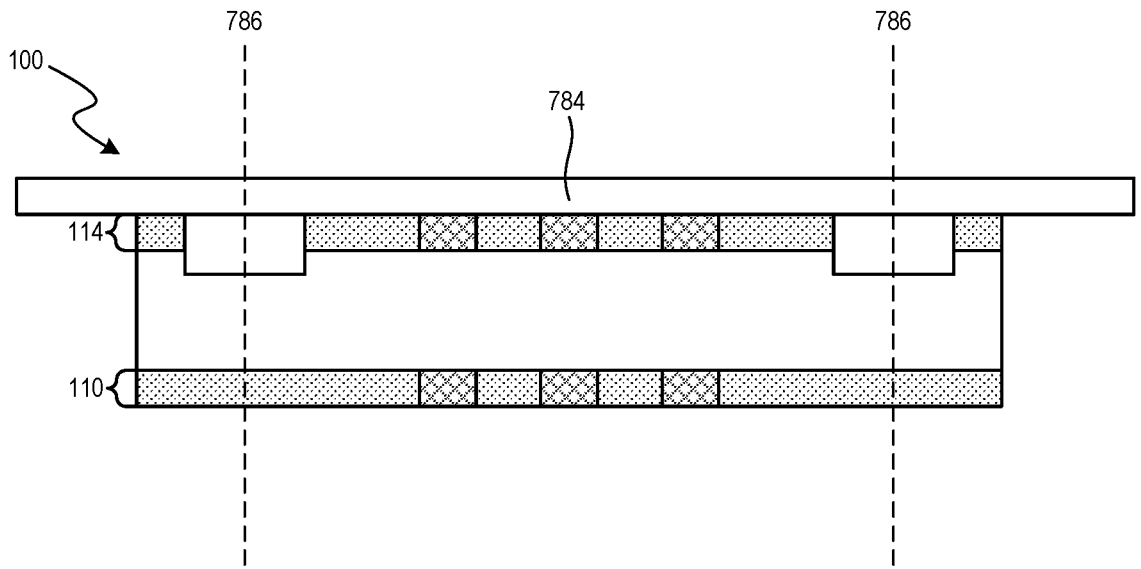

FIG. 7E illustrates the semiconductor die 100 after (i) mounting the semiconductor die 100 to a dicing frame 784 and (ii) decoupling the semiconductor die 100 from the carrier 780 (FIG. 7B). In some embodiments, the release layer 782 (FIG. 7B) allows the carrier 780 to be easily removed from the first bonding structure 110 via a vacuum, poker pin, laser or other light source, or other suitable method, such that the carrier 780 can be reused again. In other embodiments, the carrier 780 and the release layer 782 can be removed using grinding techniques (e.g., back grinding) or other suitable techniques such as dry etching processes, chemical etching processes, chemical mechanical polishing (CMP), etc. The dicing frame 784 can include a dicing tape or other structure secured to the second bonding structure 114.

Figure 7F:
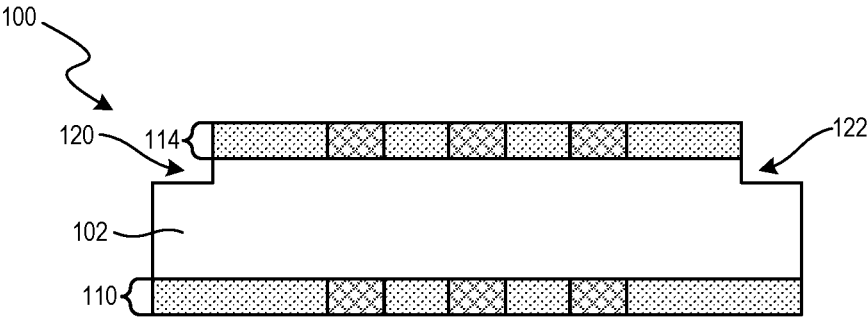

As further shown in FIG. 7E, singulating lanes 786 (e.g., saw streets, saw lanes, dicing lanes) are provided over the cavities 720, 722 to facilitate singulation of the semiconductor die 100 from a larger wafer. FIG. 7F illustrates the semiconductor die 100 after singulation. Specifically, the first bonding structure 110, the substrate 102, and the second bonding structure 114 can be cut together at the singulating lanes 786 (FIG. 7E) to separate the semiconductor die 100 and form the recesses 120, 122.

Figure 8:
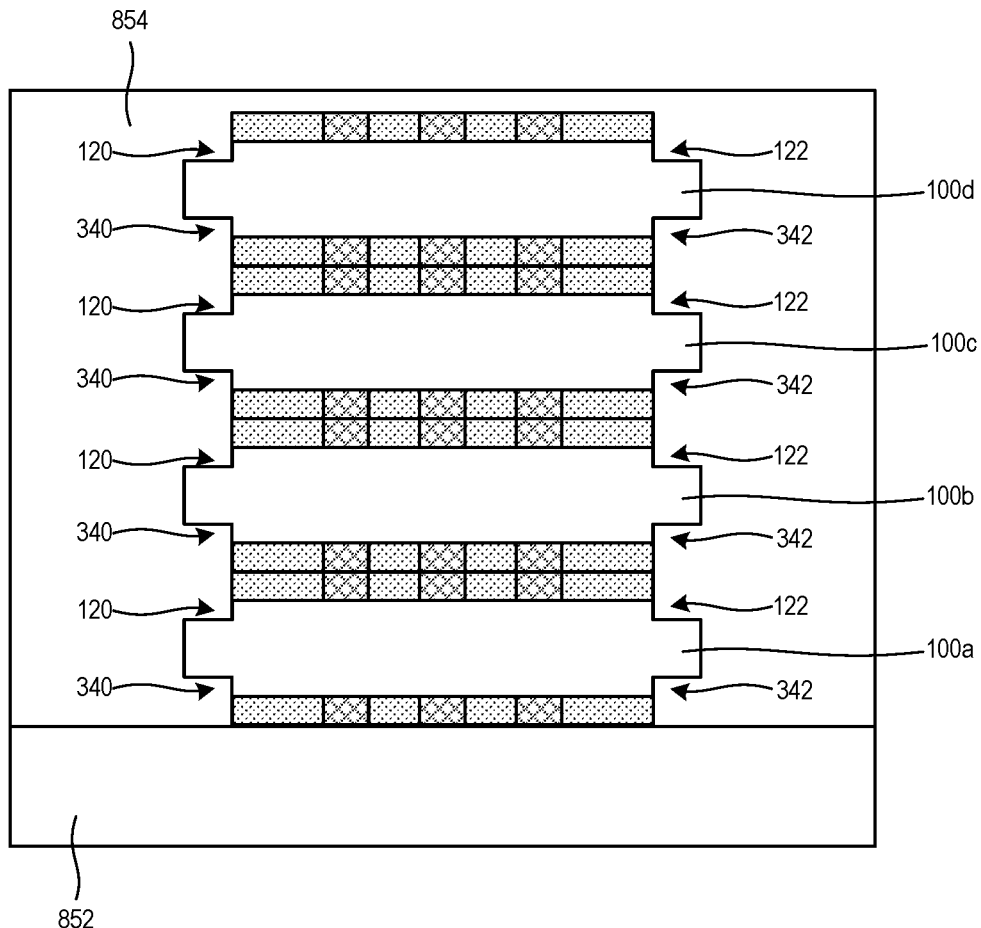
FIG. 8 is a side cross-sectional view of a semiconductor device including a plurality of the semiconductor dies shown in FIG. 3 in accordance with additional embodiments of the present technology.

FIG. 8 is a side cross-sectional view of a semiconductor device 850 including a plurality of the semiconductor dies 100 (identified individually as first through fourth semiconductor dies 100a-d, respectively) in accordance with additional embodiments of the present technology. The semiconductor dies 100 are configured as shown in FIG. 3. In the illustrated embodiment, the semiconductor dies 100 are stacked on a package substrate 852 and encapsulated by a mold material 854. As shown, the first recess 120 and the third recess 340 of adjacent ones of the semiconductor dies 100 in the stack combine to provide a relatively large overall recess (e.g., having a dimension of at least two times the depth D shown in FIG. 3) that can, for example, facilitate use of a pick tip (e.g., the tip 674 shown in FIGS. 6B and 6C) having a greater thickness (e.g., the thickness $T_4$ shown in FIG. 6B) to debond any one of the semiconductor dies 100 that may be poorly bonded during manufacturing, as described in detail above. Likewise, the second recess 122 and the fourth recess 342 of adjacent ones of the semiconductor dies 100 in the stack combine to provide a relatively large overall recess (e.g., having a dimension of at least two times the depth D shown in FIG. 3).

Figure 9:
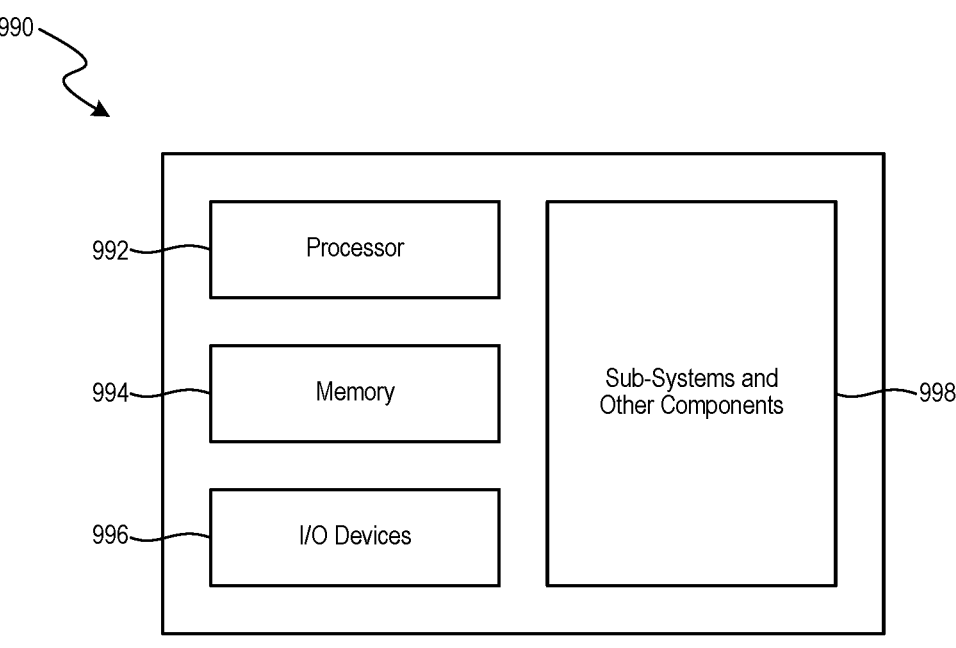
FIG. 9 is a schematic view of a system that includes a semiconductor die or semiconductor device in accordance with embodiments of the present technology.

The semiconductor dies and/or the semiconductor devices described in detail above with reference to FIGS. 1A-8 can be incorporated into any of a myriad of larger and/or more complex systems, a representative example of which is system 990 shown schematically in FIG. 9. The system 990 can include a processor 992, a memory 994 (e.g., SRAM, DRAM, NAND, flash, and/or other memory devices), input/output devices 996, and/or other subsystems or components 998. The semiconductor dies and/or the semiconductor devices described above with reference to FIGS. 1A-8 can be included in any of the elements shown in FIG. 9. The resulting system 990 can be configured to perform any of a wide variety of suitable computing, processing, storage, sensing, imaging, and/or other functions. Accordingly, representative examples of the system 990 include, without limitation, computers and/or other data processors, such as desktop computers, laptop computers, Internet appliances, hand-held devices (e.g., palm-top computers, wearable computers, cellular or mobile phones, personal digital assistants, music players, and so on), tablets, multi-processor systems, processor-based or programmable consumer electronics, network computers, and minicomputers. Additional representative examples of the system 990 include lights, cameras, vehicles, etc. With regard to these and other example, the system 990 can be housed in a single unit or distributed over multiple interconnected units, for example, through a communication network. The components of the system 990 can accordingly include local and/or remote memory storage devices and any of a wide variety of suitable computer-readable media.

The following examples are illustrative of several embodiments of the present technology:

1. A semiconductor die, comprising:
a substrate including—
   a first surface;
   a second surface opposite the first surface;
   a perimeter; and
   a recess formed into the first surface adjacent to the perimeter, wherein the recess has a depth in a direction extending between the first surface and the second surface;
a first bonding structure on the first surface and having a thickness, wherein the depth is at least ten times greater than the thickness; and
a second bonding structure on the second surface.

2. The semiconductor die of example 1 wherein the recess is sized and shaped to receive a tip of a pick device.

3. The semiconductor die of example 1 or example 2 wherein the depth is between about 1-5 μm.

4. The semiconductor die of any one of examples 1-3 wherein the thickness is between about 10-200 nm.

5. The semiconductor die any one of examples 1-4 wherein the recess is a first recess formed into the first surface of the substrate, and wherein the substrate further includes a second recess formed into the first surface of the substrate adjacent to the perimeter.

6. The semiconductor die of example 5 wherein the second recess has a same depth in the direction extending between the first surface and the second surface as the depth of the first recess.

7. The semiconductor die of example 5 or example 6 wherein the perimeter of the substrate includes a first edge opposite a second edge, wherein the first recess is formed into the first surface adjacent to the first edge, and wherein the second recess is formed into the first surface adjacent to the second edge.

8. The semiconductor die of any one of examples 1-7 wherein the recess is a first one of a plurality of recesses, and wherein each of the recesses is formed into the first surface or the second surface adjacent to the perimeter.

9. The semiconductor die of example 8 wherein each of the recesses has a same depth in the direction extending between the first surface and the second surface as the depth of the first one of the plurality of recesses.

10. The semiconductor die of any one of examples 1-9, further comprising a plurality of memory components formed in and/or embedded in the substrate.

11. The semiconductor die of any one of examples 1-10 wherein the first bonding structure is a first hybrid bonding structure including a plurality of first conductive contacts and a first passivation material around the first conductive contacts, and wherein the second bonding structure is a second hybrid bonding structure including a plurality of second conductive contacts and a second passivation material around the second conductive contacts.

12. A semiconductor device comprising:
a package substrate; and
a plurality of semiconductor dies positioned on the package substrate and arranged in a stack, wherein each of the semiconductor dies includes—
   a substrate having—
      a lower surface facing toward the package substrate;
      an upper surface opposite the lower surface and facing away from the package substrate;
      a perimeter; and
      a recess formed into the lower surface or the upper surface adjacent to the perimeter, wherein the recess has a depth in a direction extending between the lower surface and the upper surface;

a lower bonding structure on the lower surface and having a first thickness; and an upper bonding structure on the upper surface and having a second thickness, wherein the depth is at least ten times greater than the first thickness and/or the second thickness.

13. The semiconductor device of example 12 wherein the recess is sized and shaped to receive a tip of a pick device.

14. The semiconductor device of example 12 or example 13 wherein the depth is between about 1-5 μm, and wherein the first thickness and the second thickness are each between about 10-200 nm.

15. The semiconductor device of any one of examples 12-14 wherein the recess is a first recess formed into the upper surface of the substrate, wherein the substrate further includes a second recess formed into the upper surface of the substrate adjacent to the perimeter, and wherein the second recess has a same depth in the direction extending between the lower surface and the upper surface as the depth of the first recess.

16. The semiconductor device of example 15 wherein the perimeter of the substrate includes a first edge opposite a second edge, wherein the first recess is formed into the first surface adjacent to the first edge, and wherein the second recess is formed into the first surface adjacent to the second edge.

17. The semiconductor device of any one of examples 12-16 wherein the recess is a first one of a plurality of recesses, wherein each of the recesses is formed into the lower surface or the upper surface adjacent to the perimeter, and wherein each of the recesses has a same depth in the direction extending between the lower surface and the upper surface as the depth of the first one of the plurality of recesses.

18. A method of forming a semiconductor die, the method comprising:

forming a first bonding structure on a first surface of a substrate, wherein the first bonding structure has a thickness;

forming a second bonding structure on a second surface of the substrate;

etching a cavity through the first bonding structure and through a portion of the first surface of the substrate, wherein the cavity has a depth through the substrate in a direction extending between the first surface and the second surface, and wherein the depth is at least ten times greater than the thickness; and cutting the first bonding structure, the substrate, and the second bonding along a singulating lane extending through the first cavity in the direction extending between the first surface and the second surface to form a recess having the depth adjacent to a perimeter of the substrate.

19. The method of example 18 wherein the cavity is a first cavity, wherein the singulating lane is a first singulating lane, wherein the recess is a first recess, and wherein the method further comprises:

etching a second cavity through the first bonding structure and through a portion of the first surface of the substrate; and cutting the first bonding structure, the substrate, and the second bonding structure along a second singulating lane extending through the second cavity in the direction between the first surface and the second surface to form a second recess adjacent to the perimeter of the substrate.

20. The method of example 19 wherein the depth is between about 1-5 μm, wherein the thickness is between about 10-200 nm, and wherein the second recess has a same depth in the direction extending between the first surface and the second surface as the depth of the first recess.

The above detailed description of embodiments of the present technology are not intended to be exhaustive or to limit the technology to the precise forms disclosed above. Although specific embodiments of, and examples for, the technology are described above for illustrative purposes, various equivalent modifications are possible within the scope of the technology as those skilled in the relevant art will recognize. For example, although steps are presented in a given order, other embodiments may perform steps in a different order. The various embodiments described herein may also be combined to provide further embodiments.

From the foregoing, it will be appreciated that specific embodiments of the technology have been described herein for purposes of illustration, but well-known structures and functions have not been shown or described in detail to avoid unnecessarily obscuring the description of the embodiments of the technology. Where the context permits, singular or plural terms may also include the plural or singular term, respectively.

As used herein, the phrase "and/or" as in "A and/or B" refers to A alone, B alone, and A and B. To the extent any materials incorporated herein by reference conflict with the present disclosure, the present disclosure controls. Additionally, the term "comprising" is used throughout to mean including at least the recited feature(s) such that any greater number of the same feature and/or additional types of other features are not precluded. It will also be appreciated that specific embodiments have been described herein for purposes of illustration, but that various modifications may be made without deviating from the technology. Further, while advantages associated with some embodiments of the technology have been described in the context of those embodiments, other embodiments may also exhibit such advantages, and not all embodiments need necessarily exhibit such advantages to fall within the scope of the technology. Accordingly, the disclosure and associated technology can encompass other embodiments not expressly shown or described herein.

I claim:

1. A semiconductor die, comprising:
a substrate including—
a first surface;
a second surface opposite the first surface;
a perimeter comprising sidewalls extending between the first surface and the second surface; and
a recess formed into the first surface adjacent to the perimeter such that the recess defines steps in the sidewalls proximate to the second surface, wherein the recess has a depth in a first direction extending between the first surface and the second surface;
a first bonding structure on the first surface and having a thickness in a second direction parallel to the first direction, wherein the depth is at least ten times greater than the thickness; and
a second bonding structure on the second surface.

2. The semiconductor die of claim 1 wherein the recess is sized and shaped to receive a tip of a pick device.

3. The semiconductor die of claim 1 wherein the depth is between about 1-5 μm.

4. The semiconductor die of claim 1 wherein the thickness is between about 10-200 nm.

5. The semiconductor die of claim 1 wherein the recess is a first recess formed into the first surface of the substrate, and wherein the substrate further includes a second recess formed into the first surface of the substrate adjacent to the perimeter such that the second recess defines second steps in the sidewalls proximate to the first surface.

6. The semiconductor die of claim 5 wherein the second recess has a same depth in the first direction extending between the first surface and the second surface as the depth of the first recess.

7. The semiconductor die of claim 5 wherein the perimeter of the substrate includes a first edge opposite a second edge, wherein the first recess is formed into the first surface adjacent to the first edge, and wherein the second recess is formed into the first surface adjacent to the second edge.

8. The semiconductor die of claim 1 wherein the recess is a first one of a plurality of recesses, and wherein each of the recesses is formed into the first surface or the second surface adjacent to the perimeter.

9. The semiconductor die of claim 8 wherein each of the recesses has a same depth in the first direction extending between the first surface and the second surface as the depth of the first one of the plurality of recesses.

10. The semiconductor die of claim 1, further comprising a plurality of memory components formed in and/or embedded in the substrate.

11. The semiconductor die of claim 1 wherein the first bonding structure is a first hybrid bonding structure including a plurality of first conductive contacts and a first passivation material around the first conductive contacts, and wherein the second bonding structure is a second hybrid bonding structure including a plurality of second conductive contacts and a second passivation material around the second conductive contacts.

12. A semiconductor device comprising:
a package substrate; and
a plurality of semiconductor dies positioned on the package substrate and arranged in a stack, wherein each of the semiconductor dies includes—
a substrate having—
a lower surface facing toward the package substrate;
an upper surface opposite the lower surface and facing away from the package substrate;
a perimeter comprising sidewalls extending between the upper surface and the lower surface; and
a recess formed into the lower surface or the upper surface adjacent to the perimeter such that the recess defines steps in the sidewalls proximate to the lower surface or the upper surface, respectively, wherein the recess has a depth in a direction extending between the lower surface and the upper surface;
a lower bonding structure on the lower surface and having a first thickness in the direction; and
an upper bonding structure on the upper surface and having a second thickness in the direction, wherein the depth is at least ten times greater than the first thickness and/or the second thickness.

13. The semiconductor device of claim 12 wherein the recess is sized and shaped to receive a tip of a pick device.

14. The semiconductor device of claim 12 wherein the depth is between about 1-5 μm, and wherein the first thickness and the second thickness are each between about 10-200 nm.

15. The semiconductor device of claim 12 wherein the recess is a first recess formed into the upper surface of the substrate, wherein the substrate further includes a second recess formed into the upper surface of the substrate adjacent to the perimeter, and wherein the second recess has a same depth in the direction extending between the lower surface and the upper surface as the depth of the first recess.

16. The semiconductor device of claim 15 wherein the perimeter of the substrate includes a first edge opposite a second edge, wherein the first recess is formed into the upper surface adjacent to the first edge, and wherein the second recess is formed into the upper surface adjacent to the second edge.

17. The semiconductor device of claim 12 wherein the recess is a first one of a plurality of recesses, wherein each of the recesses is formed into the lower surface or the upper surface adjacent to the perimeter, and wherein each of the recesses has a same depth in the direction extending between the lower surface and the upper surface as the depth of the first one of the plurality of recesses.

18. A method of forming a semiconductor die, the method comprising:
forming a first bonding structure on a first surface of a substrate, wherein the first bonding structure has a thickness in a direction orthogonal to the first surface of a substrate;
forming a second bonding structure on a second surface of the substrate;
etching a cavity through the first bonding structure and through a portion of the first surface of the substrate, wherein the cavity has a depth through the substrate in a direction extending between the first surface and the second surface, and wherein the depth is at least ten times greater than the thickness; and
cutting the first bonding structure, the substrate, and the second bonding structure along a singulating lane extending through the cavity in the direction extending between the first surface and the second surface, wherein the singulating lane has a narrower width than the cavity such that the semiconductor die resulting from the cutting includes a recess having the depth adjacent to a perimeter of the semiconductor die such that a sidewall of the substrate includes a step proximate to the first bonding structure.

19. The method of claim 18 wherein the cavity is a first cavity, wherein the singulating lane is a first singulating lane, wherein the recess is a first recess, and wherein the method further comprises:
etching a second cavity through the first bonding structure and through a portion of the first surface of the substrate; and
cutting the first bonding structure, the substrate, and the second bonding structure along a second singulating lane extending through the second cavity in the direction between the first surface and the second surface, wherein the second singulating lane has a narrower width than the second cavity such that the semiconductor die resulting from the cutting includes a second recess adjacent to the perimeter of the semiconductor die such that a second sidewall of the substrate includes a second step proximate to the first bonding structure.

20. The method of claim 19 wherein the depth is between about 1-5 μm, wherein the thickness is between about 10-200 nm, and wherein the second recess has a same depth in the direction extending between the first surface and the second surface as the depth of the first recess.

\* \* \* \* \*